United States Patent
Fukuda

[11] Patent Number: 6,091,137
[45] Date of Patent: Jul. 18, 2000

[54] SEMICONDUCTOR DEVICE SUBSTRATE AND METHOD OF MANUFACTURING THE SAME

[75] Inventor: Masatoshi Fukuda, Kanagawa-ken, Japan

[73] Assignee: Kabushiki Kaisha Toshiba, Kawasaki, Japan

[21] Appl. No.: 08/864,958

[22] Filed: May 29, 1997

[30] Foreign Application Priority Data

May 31, 1996 [JP] Japan .................................. 8-138344

[51] Int. Cl.⁷ .................................................. H01L 23/02
[52] U.S. Cl. .......................... 257/679; 257/690; 257/774; 257/780; 257/781; 257/784; 257/787
[58] Field of Search .................................. 257/750, 784, 257/690, 734, 679, 777, 778, 779, 780, 781, 787, 774

[56] References Cited

U.S. PATENT DOCUMENTS

| | | | |
|---|---|---|---|
| 3,663,376 | 5/1972 | Uchytil et al. | 204/15 |
| 4,264,917 | 4/1981 | Ugon | 257/668 |
| 4,703,420 | 10/1987 | Irwin | 364/200 |
| 4,837,628 | 6/1989 | Sasaki | 358/209 |
| 4,882,702 | 11/1989 | Struger et al. | 364/900 |
| 4,916,662 | 4/1990 | Mizuta | 365/52 |
| 4,943,464 | 7/1990 | Gloton et al. | 428/76 |
| 4,980,856 | 12/1990 | Ueno | 364/900 |
| 5,018,017 | 5/1991 | Sasaki et al. | 358/209 |
| 5,036,429 | 7/1991 | Kaneda et al. | 361/392 |
| 5,153,818 | 10/1992 | Mukougawa et al. | 361/395 |
| 5,172,338 | 12/1992 | Mehrotra et al. | 365/185 |
| 5,184,282 | 2/1993 | Kaneda et al. | 361/395 |
| 5,272,374 | 12/1993 | Kodai et al. | 257/679 |
| 5,293,236 | 3/1994 | Adachi et al. | 348/231 |
| 5,297,148 | 3/1994 | Harari et al. | 371/10.2 |
| 5,299,089 | 3/1994 | Lwee | 361/684 |
| 5,343,319 | 8/1994 | Moore | 359/152 |
| 5,375,037 | 12/1994 | Le Roux | 361/684 |
| 5,430,859 | 7/1995 | Norman et al. | 395/425 |
| 5,438,359 | 8/1995 | Aoki | 348/207 |
| 5,457,590 | 10/1995 | Barrett et al. | 360/133 |
| 5,469,399 | 11/1995 | Sato et al. | 365/226 |
| 5,475,441 | 12/1995 | Parulski et al. | 348/552 |
| 5,488,433 | 1/1996 | Washino et al. | 348/722 |
| 5,508,971 | 4/1996 | Cernea et al. | 365/185.23 |
| 5,535,328 | 7/1996 | Harari et al. | 395/182.05 |
| 5,550,709 | 8/1996 | Iwasaki | 361/684 |
| 5,563,825 | 10/1996 | Cernea et al. | 365/185.18 |
| 5,568,424 | 10/1996 | Cernea et al. | 365/185.33 |

(List continued on next page.)

FOREIGN PATENT DOCUMENTS

| | | |
|---|---|---|
| 214478 | 3/1987 | European Pat. Off. . |
| 59/90938 | 5/1984 | Japan . |
| 02120093 | 5/1990 | Japan . |
| 4-16396 | 1/1992 | Japan . |
| 08319456 | 5/1996 | Japan . |

Primary Examiner—Olik Chaudhuri
Assistant Examiner—Alonzo Chambliss
Attorney, Agent, or Firm—Pillsbury Madison & Sutro LLP

[57] ABSTRACT

A semiconductor device is provided that includes a substrate having a first side, a second side, and a through-hole. An external connection terminal is located on the first side of the substrate, and a chip connection terminal is located on the second side of the substrate. The chip connection terminal is electrically connected to the external connection terminal via the through-hole. In one preferred embodiment, the external connection terminal, the inner portion of the through hole, and a first portion of the chip connection terminal have a hard gold plating, and a second portion of the chip connection terminal has a soft gold plating. In another preferred embodiment, the chip connection terminal, the inner portion of the through hole, and a first portion of the external connection terminal have a soft plating, and a second portion of the external connection terminal has a hard gold plating. Thus, in the present invention, there is no plating boundary located within the through-hole, so the reliability of the interconnection that passes through the through-hole is improved. The present invention also provides a method of manufacturing such a device.

18 Claims, 8 Drawing Sheets

U.S. PATENT DOCUMENTS

| | | | |
|---|---|---|---|
| 5,572,478 | 11/1996 | Sato et al. | 365/226 |
| 5,584,043 | 12/1996 | Burkart | 395/882 |
| 5,592,420 | 1/1997 | Cernea et al. | 365/185.18 |
| 5,596,532 | 1/1997 | Cernea et al. | 365/185.18 |
| 5,602,987 | 2/1997 | Harari et al. | 395/182.06 |
| 5,608,673 | 3/1997 | Rhee | 365/185.33 |
| 5,611,057 | 3/1997 | Pecone et al. | 395/282 |
| 5,615,344 | 3/1997 | Corder | 395/309 |
| 5,621,685 | 4/1997 | Cernea et al. | 365/185.18 |
| 5,638,321 | 6/1997 | Lee et al. | 365/185.17 |
| 5,663,901 | 9/1997 | Wallace et al. | 365/52 |
| 5,671,229 | 9/1997 | Harari et al. | 371/10.2 |
| 5,693,570 | 12/1997 | Cernea et al. | 438/107 |
| 5,736,789 | 4/1998 | Moswicki | 257/787 |
| 5,887,145 | 3/1999 | Harari et al. | 395/282 |

SEMICONDUCTOR DEVICE SUBSTRATE AND METHOD OF MANUFACTURING THE SAME

FIELD OF THE INVENTION

The present invention relates to a semiconductor device substrate, and more specifically to a semiconductor device substrate for use in a semiconductor device of the type used in card-type modules, information memory devices, IC cards, or the like, and a method of manufacturing the same.

BACKGROUND OF THE INVENTION

Recently, card-type memory devices such as IC cards have been brought into practical use. In a card-type memory device, a semiconductor chip is mounted in a semiconductor package. Typically, the semiconductor package has the chip resin-molded on one side and a planar-type external connection terminal on the other side. The chip may be a nonvolatile semiconductor memory device or any other type of semiconductor chip.

FIGS. 9, 10(a), and 10(b) show a conventional semiconductor package for a card-type memory device. FIG. 9 is a cross-sectional view of the semiconductor package, FIG. 10(a) is a perspective view of the chip side of the semiconductor package, and FIG. 10(b) is a perspective view of the external terminal side of the semiconductor package. As shown in FIG. 9, a substrate 1 is formed of resin, which has a thickness of approximately 0.1–0.4 mm, and a semiconductor chip 6 is bonded to the substrate 1 by an adhesive 9. A gold wire 7 provides an electrical connection between a chip connection terminal 2 of the substrate 1 and a bonding pad of the semiconductor chip 6. The chip side of the substrate 1 is molded by a resin 8 that covers the semiconductor chip 6, and an external connection terminal 3 is provided on the other side of the substrate 1. The external connection terminal 3 is electrically connected to the chip connection terminal 2 via a through-hole 4 that penetrates the substrate 1.

FIG. 8 shows a cross-sectional view of the substrate used in the conventional semiconductor package of FIG. 9. (In the different figures, elements that are the same are represented by the same reference numerals and duplicate descriptions thereof are omitted.) The chip connection terminal 2, which is located on the chip side of the substrate 1, is typically plated with soft gold with a purity of 99.9% or higher. The soft gold on the chip connection terminal 2 provides a good connection between the bonding wire 7 and the chip connection terminal 2 because soft gold or aluminum is typically used for the bonding wire that is connected between the chip's bonding pad and the chip connection terminal of the substrate 1. On the other hand, the external connection terminal 3, which is located on the side of the substrate opposite the semiconductor chip 6, is typically plated with hard gold with a purity of approximately 99%. Hard gold is used for the external connection terminal because it offers a greater resistance to damage. Thus, a boundary 5 between the soft gold plating and the hard gold plating is located at a central portion of the through-hole 4. For simplification, FIG. 8 does not individually show the gold plating, nickel plating, and copper plating and foil that are described below. These layers are collectively shown as the chip connection terminal and the external connection terminal in FIG. 8.

FIGS. 11(a) through 11(f) show a typical manufacturing process for the conventional semiconductor device substrate described above. First, copper foils 24 with an illustrative thickness of about 18 μm are attached using an adhesive to both sides of a resin substrate 1, as shown in FIG. 11(a). The substrate 1 is then drilled to open a through-hole 4, as shown in FIG. 11(b). Next, as shown in FIG. 11(c), the entire substrate is plated with copper so that copper plating 25 is provided on the inner side of the through-hole and on both sides of the substrate. Thus, the copper plating provides an electrical connection between the two sides of the substrate. A photoresist-type dry film is then pasted onto the copper of the substrate and a copper interconnection is formed through exposure of light, patterning, and etching of the copper, as shown in FIG. 11(d).

The copper interconnections are typically formed of both copper foils and copper plating because the copper foils can be used to easily and quickly increase the thickness of the connection by merely pasting them onto the substrate. However, the copper foil cannot be attached to the inner side of the through-hole to complete the interconnection. On the other hand, it is rather difficult to increase the thickness of the connection terminal through copper plating because of the slow progress of the plating process. In cases where a low relative thickness or slow progress are not drawbacks, it is possible to omit the copper foils and use only the copper plating to form the copper interconnections.

In the next step of the manufacturing process, the chip-mounting side of the substrate is entirely masked using a tape or photoresist-type dry film. Bright nickel (not shown) and hard gold are then consecutively plated on the substrate to provide a hard gold plating 3 over the copper interconnection on the external terminal side of the substrate and on the inside of the through-hole 4, as shown in FIG. 11(e). Then, the hard gold-plated external terminal side of the substrate is entirely masked using a tape or dry film. Non-bright or semi-bright nickel (not shown) and soft gold are then consecutively plated on the substrate to provide soft gold plating 2 over the copper interconnection on the chip-mounting side of the substrate and on the inside of the through-hole 4, as shown in FIG. 11(f). The nickel plating is interposed between the copper plating and the gold plating because the intervening nickel layer prevents a slow diffusion of the gold into the copper. In another typical manufacturing process, the order of the gold plating is reversed so that soft gold is first plated on the chip-mounting side and then hard gold is plated on the external terminal side of the substrate.

In such conventional manufacturing processes, one side of the through-hole 4 is closed by the masking during both soft gold and hard gold plating. As a result, air builds up in the through-hole 4 and the plating solution is prevented from flowing through the through-hole 4. Therefore, in some cases, no plating is attained at the central portion of the through-hole 4. Whenever the through-hole 4 has portions that are not plated by either the soft gold or hard gold, the underlying metal layer of copper or nickel is exposed to oxygen and the like. This allows corrosive action to occur in the exposed portion of the through-hole so that a breakage of the interconnection between the two sides of the substrate may result. On the other hand, there is a possibility that the underlying metal layer of copper or nickel is exposed to hydrogen or the like. For example, when the nickel is soluble in water, the nickel is subject to ionization. This allows the solution of nickel to occur in the exposed portion of the through-hole.

SUMMARY OF THE INVENTION

In view of these problems, it is an object of the present invention to remove the above-mentioned drawbacks and to provide a semiconductor substrate in which the inside of the through-hole is completely plated in order to improve the reliability of the interconnection. To achieve this object, the through-hole in the substrate is not blocked when it is selectively plated. As a result, the plating solution readily flows through and near the through-hole so that plating is provided on the surface of the through-hole. Thus, there is no plating boundary located within the through-hole, so corrosive action is prevented in the underlying layers in the through-hole portion and the reliability of the interconnection that passes through the through-hole is improved. The present invention also provides a method of manufacturing such a device.

According to a first embodiment of the present invention, a semiconductor device is provided that includes a substrate having a first side, a second side, and a through-hole. An external connection terminal is located on the first side of the substrate, and a chip connection terminal is located on the second side of the substrate. The chip connection terminal is electrically connected to the external connection terminal via the through-hole. The external connection terminal, the inner portion of the through hole, and a first portion of the chip connection terminal have a hard gold plating, and a second portion of the chip connection terminal has a soft gold plating.

According to a second embodiment of the present invention, a semiconductor device is provided that includes a substrate having a first side, a second side, and a through-hole. An external connection terminal is located on the first side of the substrate, and a chip connection terminal is located on the second side of the substrate. The chip connection terminal is electrically connected to the external connection terminal via the through-hole. The chip connection terminal, the inner portion of the through hole, and a first portion of the external connection terminal have a soft plating, and a second portion of the external connection terminal has a hard gold plating.

According to a third embodiment of the present invention, a method is provided for manufacturing a semiconductor device by making an interconnection pattern of copper plating on a first side and a second side of a substrate and on the inner side of a through-hole. A first mask is formed on the first side of the substrate so as to cover a portion of the interconnection pattern on the first side without covering the through-hole. Nickel and then hard gold are plated on the portion of the interconnection pattern that is not covered by the first mask (including the inner side of the through-hole), and then the first mask is removed. A second mask is then formed to cover the portion of the interconnection pattern that was plated with hard gold. Nickel and then soft gold are plated on the portion of the interconnection pattern that is not covered by the second mask, and then the second mask is removed.

According to a fourth embodiment of the present invention, a method is provided for manufacturing a semiconductor device by making an interconnection pattern of copper plating on a first side and a second side of a substrate and on the inner side of a through-hole. A first mask is formed on the first side of the substrate so as to cover a portion of the interconnection pattern on the first side and the through-hole. Nickel and then soft gold are plated on the portion of the interconnection pattern that is not covered by the first mask, and then the first mask is removed. A second mask is then formed to cover the portion of the interconnection pattern that was plated with soft gold. Nickel and then hard gold are plated on the portion of the interconnection pattern that is not covered by the second mask (including the inner side of the through-hole), and then the second mask is removed.

According to a fifth embodiment of the present invention, a semiconductor device is provided that includes a substrate having a first side, a second side, and a through-hole. An external connection terminal is located on the first side of the substrate, and a chip connection terminal is located on the second side of the substrate. The chip connection terminal is electrically connected to the external connection terminal via the through-hole. A semiconductor chip is attached to the second side of the substrate and electrically connected to the chip connection terminal, and a resin molding covers at least a portion of the second side of the substrate. The external connection terminal, the inner portion of the through hole, and a first portion of the chip connection terminal have a hard gold plating, and a second portion of the chip connection terminal has a soft gold plating.

According to a sixth embodiment of the present invention, a semiconductor device is provided that includes a substrate having a first side, a second side, and a through-hole. An external connection terminal is located on the first side of the substrate, and a chip connection terminal is located on the second side of the substrate. The chip connection terminal is electrically connected to the external connection terminal via the through-hole. A semiconductor chip is attached to the second side of the substrate and electrically connected to the chip connection terminal, and a resin molding covers at least a portion of the second side of the substrate. The chip connection terminal, the inner portion of the through hole, and a first portion of the external connection terminal have a soft plating, and a second portion of the external connection terminal has a hard gold plating.

The some embodiments of the present invention provide a card-type module that includes the semiconductor device of the previously-described embodiments. Additionally, some embodiments of the present invention provide a memory device having such a card-type module and a main body. The main body includes a first connector connected to the external connection terminal of the card-type module, a second connector connected to an apparatus, and an interface control circuit connected to the first and second connectors.

Other objects, features, and advantages of the present intention will become apparent from the following detailed description. It should be understood, however, that the detailed description and specific examples, while indicating preferred embodiments of the present invention, are given by way of illustration only and various modifications may naturally be performed without deviating from the scope of the present invention.

DETAILED DESCRIPTION OF PREFERRED EMBODIMENTS

Preferred embodiments of the present invention will be described in detail hereinbelow with reference to the attached drawings.

Figure 1:
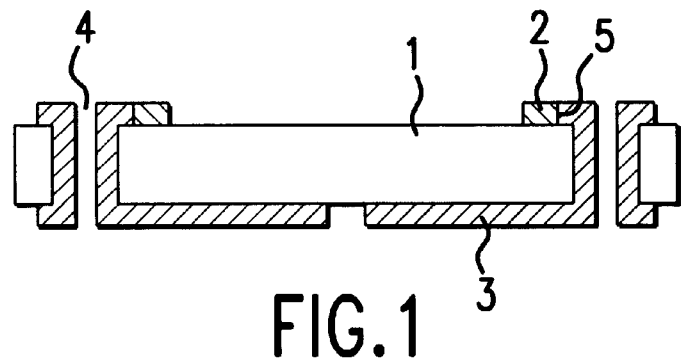
FIG. 1 is a cross-sectional view showing a substrate according to a preferred embodiment of the present invention.

FIG. 1 shows a semiconductor device substrate according to a preferred embodiment of the present invention, and FIG. 6 shows a preferred manufacturing process for the semiconductor device substrate of FIG. 1. First, copper foils 24 with an illustrative thickness of 18 μm are attached using an adhesive to both sides of a resin substrate 1, as shown in FIG. 6(a). In the preferred embodiment, the substrate is a high strength substrate formed of a glass fiber framework that is covered by an epoxy resin. A through-hole 4 is then formed by drilling through the substrate, as shown in FIG. 6(b). Next, as shown in FIG. 6(c), the entire substrate is plated with copper so that copper plating 25 is provided on the inner side of the through-hole 4 and on both sides of the substrate 1. The copper plating 25, which provides an electrical connection between the two sides of the substrate, is illustratively formed with a thickness of about 10 to 15 μm. As shown in FIG. 6(d), a copper interconnection is then formed using a photoresist-type dry film or the like. For example, when a dry film is used, it is pasted onto the copper 25 of the substrate and a copper interconnection is formed by sequentially performing exposure to light, patterning, and etching of the copper.

Figure 6A:
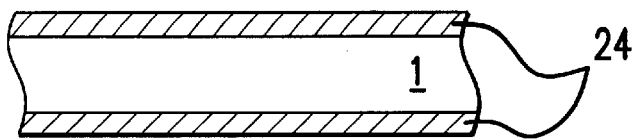
FIGS. 6(a) through 6(f) are views showing a manufacturing process for the substrate according to the preferred embodiment of the present invention.
Figure 6B:
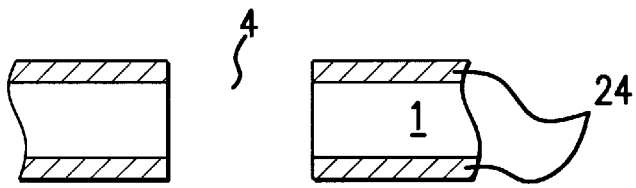
Figure 6C:
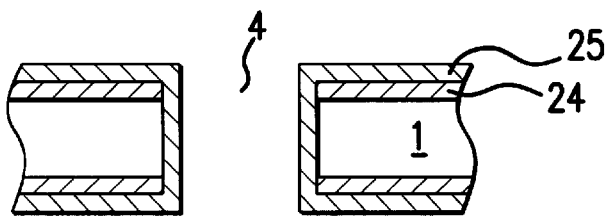
Figure 6D:
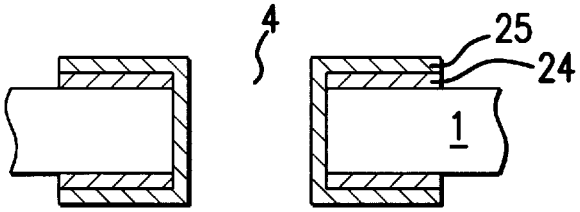
Figure 6E:
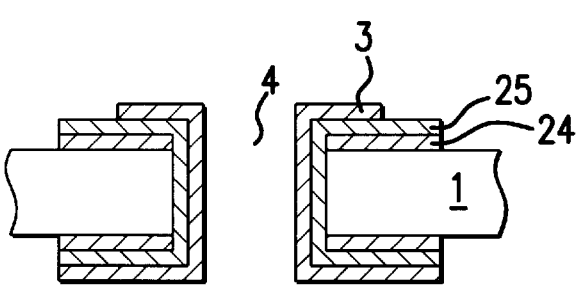

Next, the portion of the interconnection on the chip-mounting side of the substrate is masked. However, while the chip connection terminal is masked, the through-hole 4 is not masked. Such a mask can be formed by adhering a pre-shaped tape to the substrate, or by applying a dry film over the entire chip-mounting side of the substrate and then patterning the film using a lithography technique or the like. The substrate is then consecutively subjected to bright-nickel plating (not shown) and hard gold plating to provide a hard gold plating 3 over the interconnection pattern, as shown in FIG. 6(e). Because the through-hole 4 is not closed at its top or bottom by the mask, the plating solution readily flows through and near the through-hole 4. Thus, the hard gold plating 3 covers the entire copper interconnection on the external terminal side of the substrate, the entire copper interconnection layer on the inner side of the through-hole 4, and the unmasked portion of the copper interconnection on the chip-mounting side of the substrate.

Figure 6F:
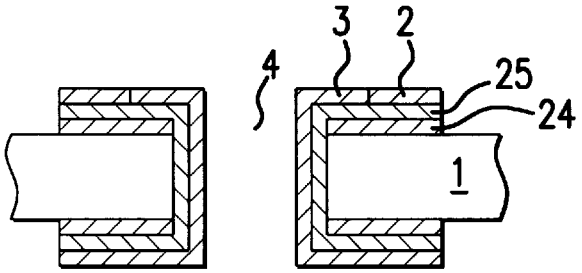

After removing the above-mentioned mask, the hard gold-plated portion 3 is newly masked in the same manner as described above. Then, the unmasked portion is consecutively subjected to non-bright nickel plating (not shown) and soft gold plating to provide a soft gold plating 2 over the interconnection pattern. The new mask is then also removed. As a result, the soft-gold plating 2 is provided on the unmasked portion of the chip connection terminal (of the copper interconnection) on the chip-mounting side of the substrate, as shown in FIG. 6(f). For simplification, FIGS. 1–3 do not individually show the gold plating, nickel plating, and copper plating and foil described above. These layers are collectively shown as the chip connection terminal and the external connection terminal in these figures.

Accordingly, in the embodiment of the present invention described above, the entire copper interconnection layer on the inner side of the through-hole 4 is covered with the hard gold plating 3 so that the boundary 5 between the soft gold plating and the hard gold plating is located outside of the through-hole 4.

In further embodiments of the present invention, the above gold plating order is reversed. That is, soft gold is first plated to the chip connection terminal on the chip-mounting side of the substrate, and then hard gold is plated on the entire copper interconnection on the external terminal side of the substrate, the entire copper interconnection layer on the inner side of the through-hole 4, and the non-soft gold plated portion of the copper interconnection on the chip-mounting side of the substrate.

Figure 4:
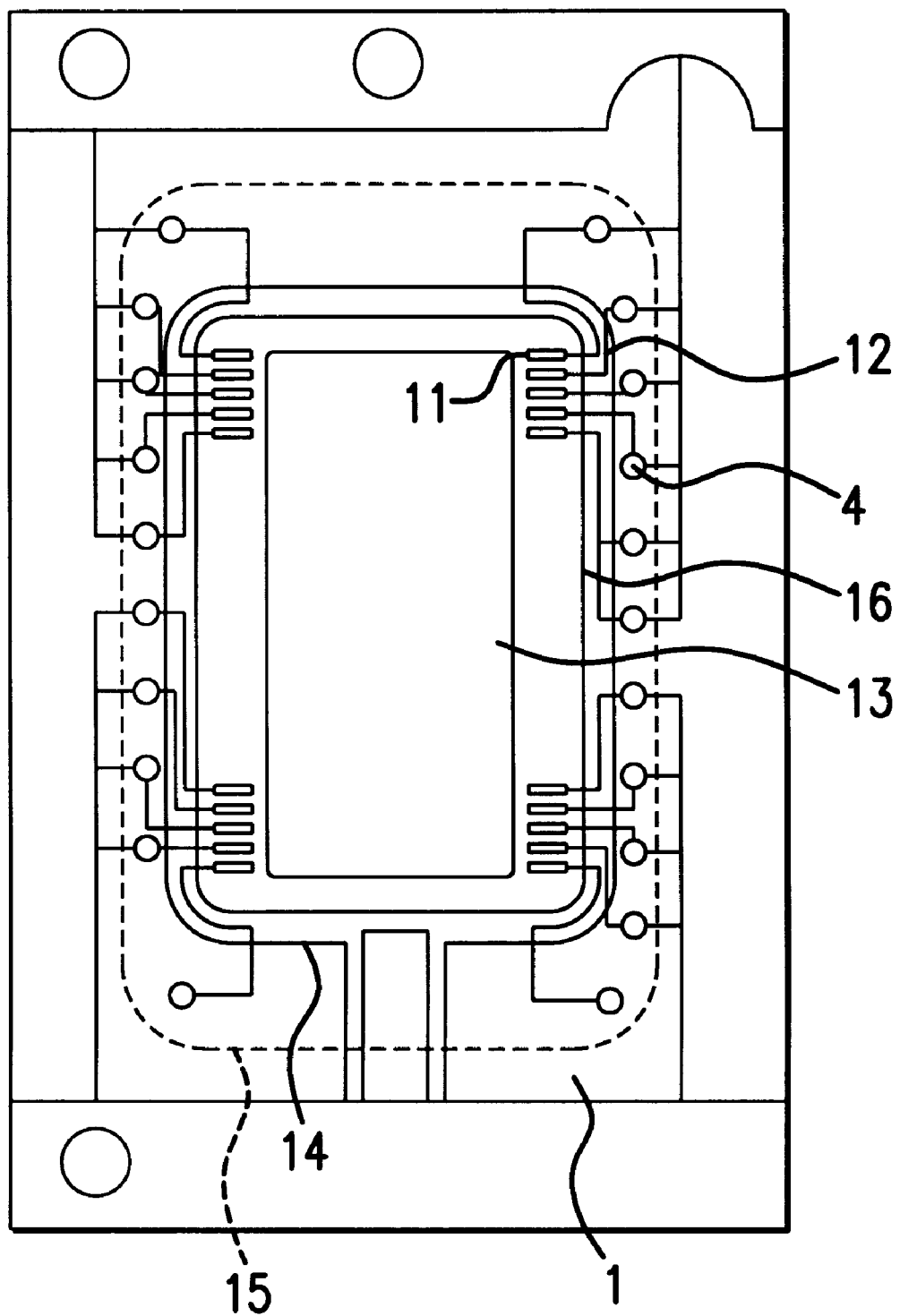
FIG. 4 is a top view showing the substrate according to the preferred embodiment of the present invention.

FIG. 4 shows a top view of the semiconductor device substrate of FIG. 1. An interconnection 12 extends from a chip connection terminal 11, through a through-hole 4, and to an external connection terminal on the opposite side of the substrate 1. A semiconductor chip is mounted on a chip mount surface portion 13 of the substrate, and resin molding is performed on the area within resin molding boundary line 14. Further, a cutting line 15 shows the line along which the semiconductor module is cut after the substrate 1 is mounted with a semiconductor chip and then resin molded. A gold plating boundary line 16 represents a boundary between the soft gold plating and the hard gold plating of the interconnections. More specifically, the inner side of the gold plating boundary line 16 is plated with soft gold, and the outer side is plated with hard gold. In further embodiments, the gold plating boundary line 16 is on the outer side of the resin molding boundary line 14.

Figure 2:
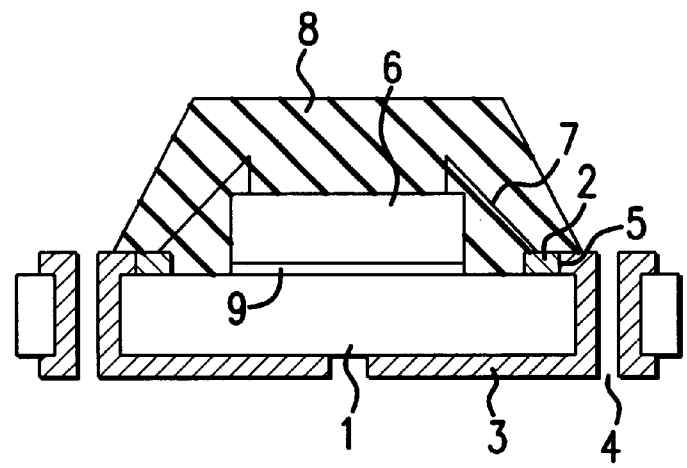
FIG. 2 is a cross-sectional view showing a semiconductor device according to a preferred embodiment of the present invention.

FIG. 2 shows a semiconductor package according to a preferred embodiment of the present invention. The semiconductor package is formed by bonding a semiconductor chip 6 to the substrate of FIG. 1 by an adhesive 9. A bonding pad of the semiconductor chip 6 is connected by a gold wire 7 to the chip connection terminal of the substrate 1, and the chip-mounting side of the substrate is molded by resin 8. In the preferred embodiment, the resin 8 is an epoxy resin and the semiconductor chip is a nonvolatile semiconductor memory device such as a NAND-type Flash EEPROM. However, the chip may be any type of semiconductor chip. Additionally, in another embodiment of the semiconductor package of the present invention, the semiconductor chip is connected to the chip connection terminal of the substrate through a flip-chip-type connection that utilizes a bump 10, as shown in FIG. 3.

Figure 3:
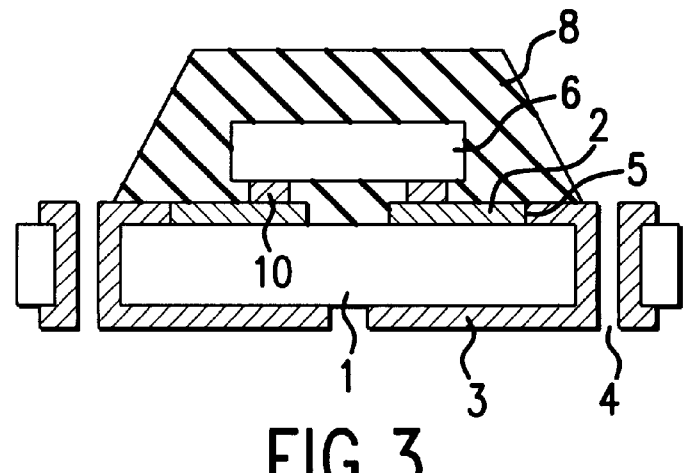
FIG. 3 is a cross-sectional view showing another embodiment of a semiconductor device according to the present invention.
Figure 5:
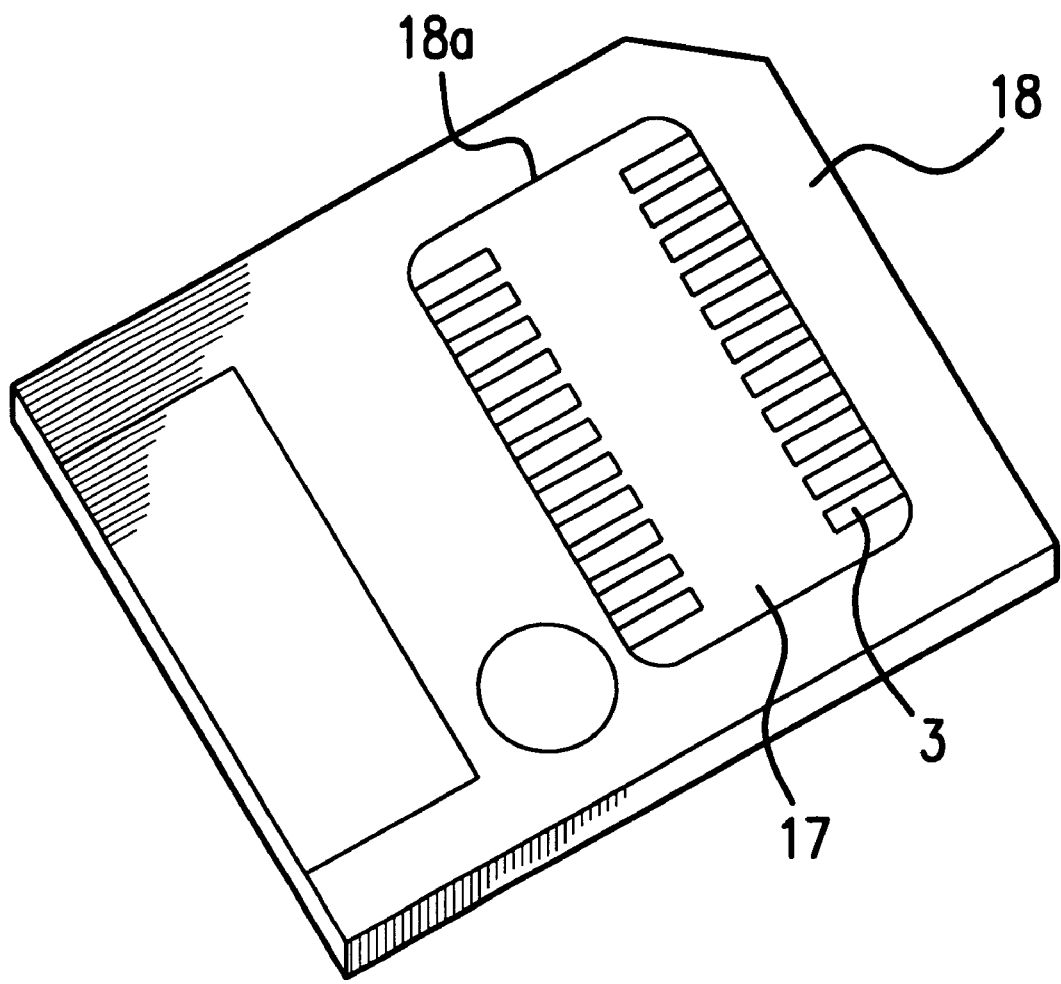
FIG. 5 is a perspective view showing a card-type module according to a preferred embodiment of the present invention.

The semiconductor packages of FIGS. 2 and 3 may be used in a card-type module, as shown in FIG. 5. The card-type module is smaller than a typical IC card, which is connected to a personal computer or the like. For example, in the preferred embodiment, the card-type module employs a base card 18 that is illustratively formed of resin and has an illustrative length, width, and thickness of 37 mm by 45 mm by 0.76 mm. The base card is provided with a recessed portion 18a that holds the semiconductor package. More specifically, the semiconductor package 17 is bonded to the base card 18 by burying the resin-molded side of the semiconductor package 17 into the recessed portion 18a of the base card in such a manner that the external terminal 3 side of the package is flush with the surface of the base card 18. In the preferred embodiment, the card-type module contains a nonvolatile semiconductor memory device so that it is analogous to a floppy disk. That is, the card-type module contains the storage portion but not the driver portion of the complete storage device. The driver portion (i.e., processing circuitry and the like) is located in an adaptor card (of a personal computer), a digital camera, or other electronic device. Thus, the storage portion of the memory device can be exchanged, just like a floppy disk, by exchanging the card-type module.

Figure 7A:
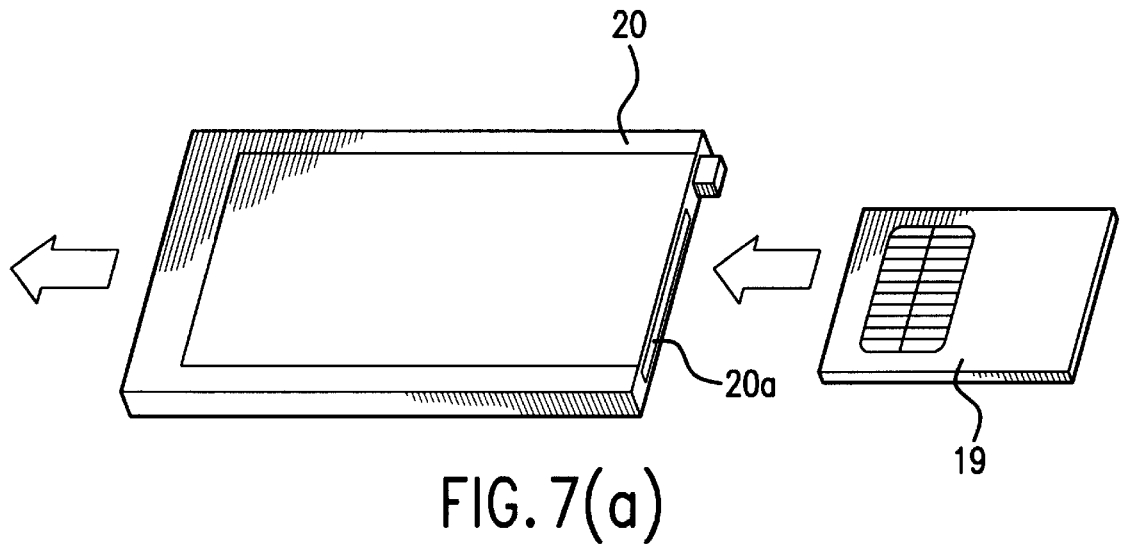
FIGS. 7(a) and 7(b) are perspective views showing an adapter card according to a preferred embodiment of the present invention.
Figure 7B:
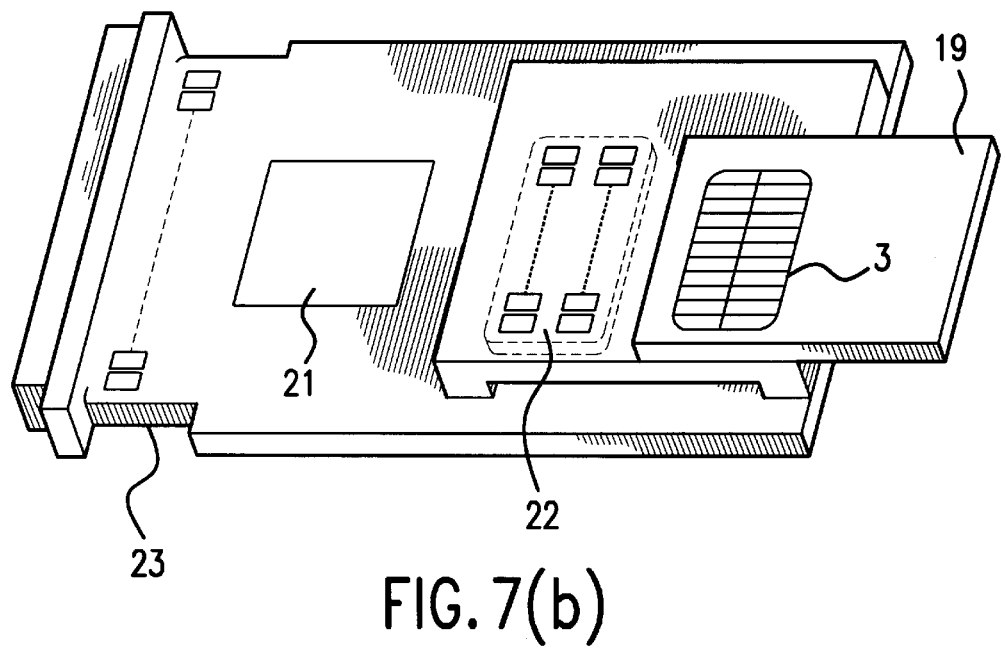
Figure 8:
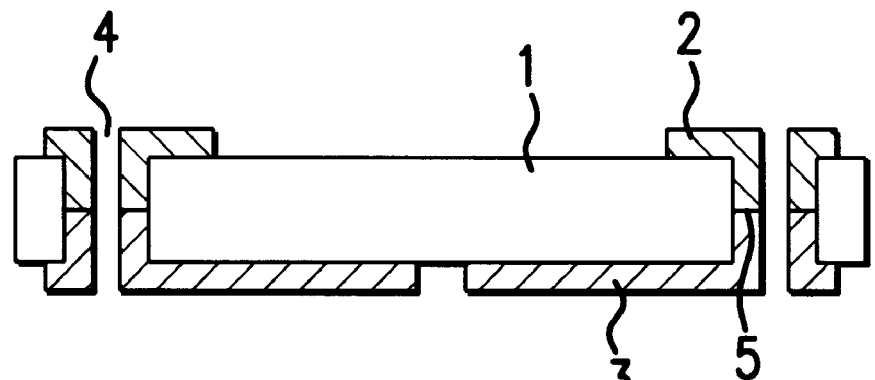
FIG. 8 is a cross-sectional view showing a conventional substrate.
Figure 9:
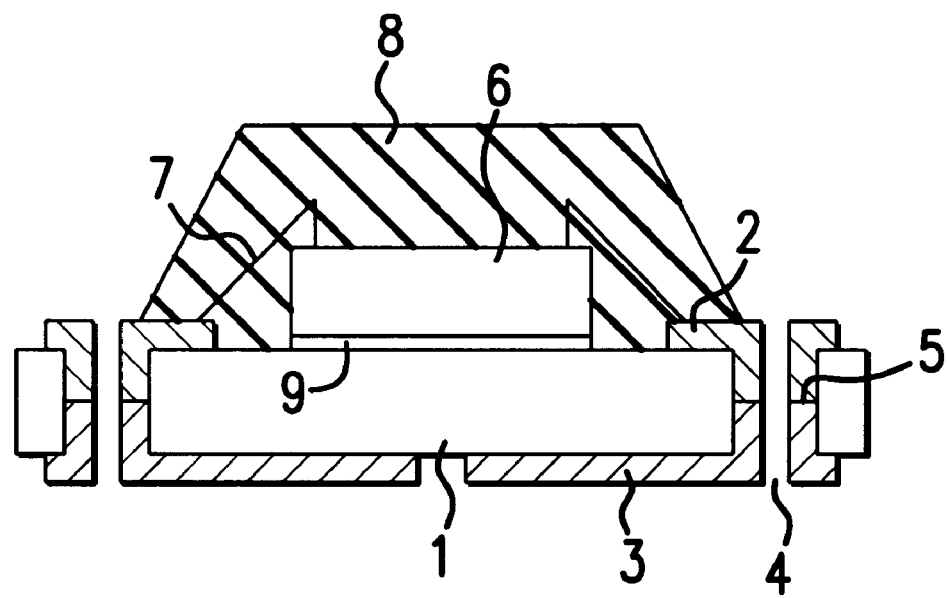
FIG. 9 is a cross-sectional view showing a conventional semiconductor device.
Figure 10A:
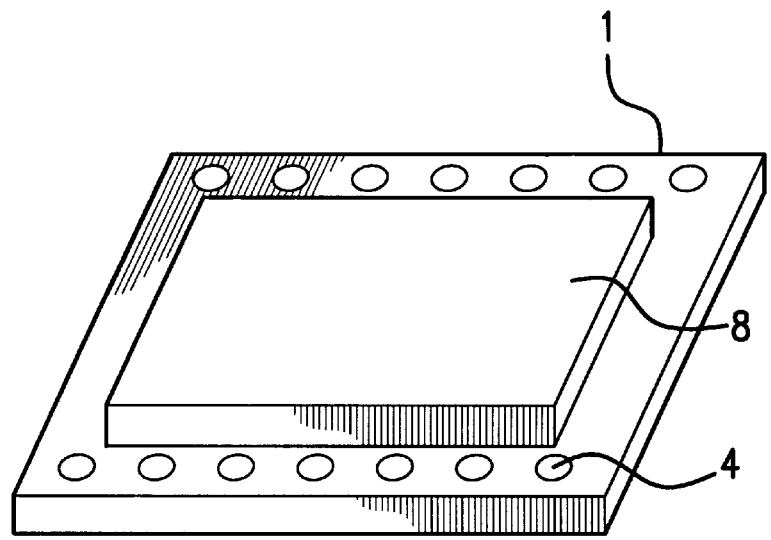
FIGS. 10(a) and 10(b) are perspective views showing the conventional semiconductor device.
Figure 10B:
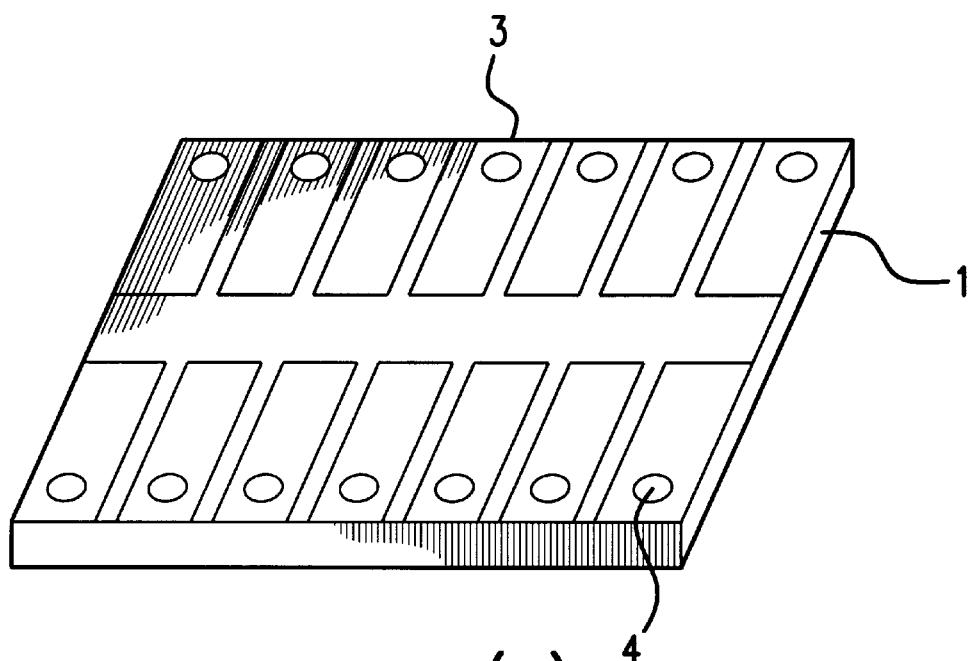
Figure 11A:
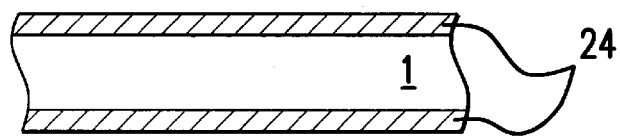
FIGS. 11(a) through 11(f) are views showing a process for manufacturing the substrate of the conventional semiconductor device.
Figure 11B:
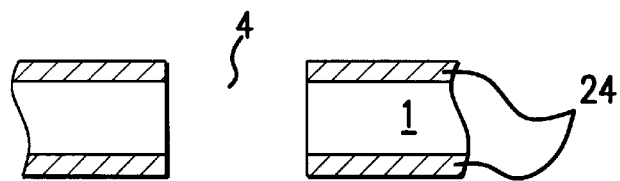
Figure 11C:
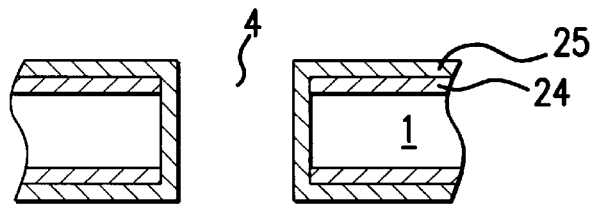
Figure 11D:
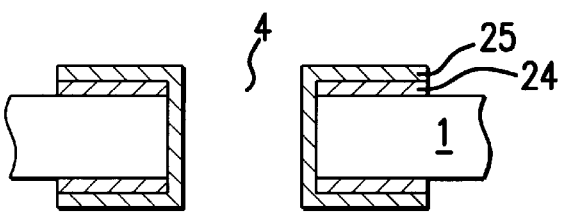
Figure 11E:
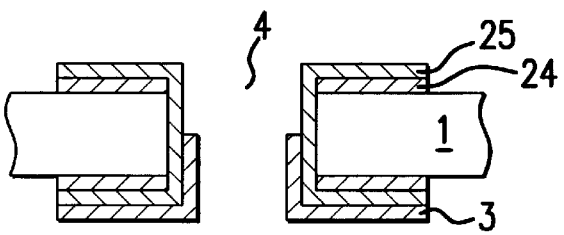
Figure 11F:
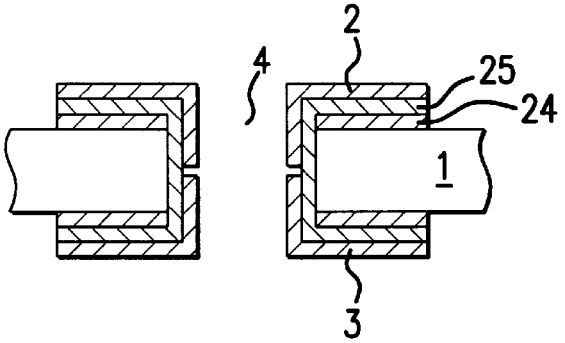

FIGS. 7(a) and 7(b) show an adapter card that allows the card-type module of FIG. 5 to be connected to a PCMCIA card slot or the like so that the card-type module can be interfaced with a personal computer, digital camera, or other electronic device. As shown in FIG. 7(a), the adapter card 20 has the outer appearance of a PCMCIA card and includes an insertion hole 20a for receiving a card-type module 19. As shown in FIG. 7(b), one connector 23 allows the adaptor card to be attached to the PCMCIA card slot of a personal computer, electronic device, or the like, and another connector 22 in the interior of the adapter card 20 contacts with the external connection terminals 3 of the card-type module 19. Additionally, an interface circuit 21 functions as an interface between the card-type module 19 and an external apparatus, such as a personal computer.

In alternative embodiments, the adapter is of a form other than the card-type that is attached to a PCMCIA card slot. In still other embodiments, a drive circuit or the like may be provided in the interior of the adapter card 20 to control the card-type module. Furthermore, the connector 22 that contacts with the external connection terminals 3 of the card-type module may be provided, typically along with the interface circuit 21 and the like, in the main body of a personal computer, digital camera, or other electronic device.

While in the embodiments described above the substrate is formed of resin, in further embodiments, the substrate is formed of TAB tape. More specifically, tape automating bonding ("TAB") is used to form a thinner semiconductor package in which the wires connected to the chip electrodes are formed by copper plating on the insulation tape film. Further, in the embodiments described above, the semiconductor substrate has hard gold plating located on the external terminal side of the substrate, the inner side of the through-hole, and a portion of the chip-mounting side of the substrate. However, the present invention is not limited to only that specific structure. For example, the sides could be reversed, the soft gold and hard gold plating portions could be switched, or all soft gold plating could be used.

As described above, the present invention provides a semiconductor substrate having a through-hole which is not blocked when it is selectively plated. As a result, the plating solution readily flows through and near the through-hole so that plating is provided on the surface of the through-hole. Furthermore, there is no plating boundary located within the through-hole, so corrosive action is prevented in the underlying layers in the through-hole portion. Thus, the reliability of the interconnection that passes through the through-hole is improved.

While there has been illustrated and described what are presently considered to be the preferred embodiments of the present invention, it will be understood by those in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A semiconductor device comprising:
    a substrate having a first side, a second side, and a through-hole formed so as to penetrate the first side and the second side;
    an external connection terminal on the first side of the substrate; and
    a chip connection terminal on the second side of the substrate, the chip connection terminal being electrically connected to the external connection terminal via the through-hole,
    wherein the external connection terminal, an inner portion of the through-hole, and a first portion of the chip connection terminal have a hard gold plating, a second portion of the chip connection terminal has a soft gold plating, and the second portion is continuous with the first portion without overlap.

2. The semiconductor device as defined in claim 1, wherein the external connection terminal has a flat portion.

3. The semiconductor device as defined in claim 1, wherein the chip connection terminal has a flat portion.

4. The semiconductor device as defined in claim 1, wherein the chip connection terminal is located on the periphery of the substrate.

5. A semiconductor device comprising:
    a substrate having a first side, a second side, and a through-hole formed so as to penetrate the first side and the second side;
    an external connection terminal on the first side of the substrate; and
    a chip connection terminal on the second side of the substrate, the chip connection terminal being electrically connected to the external connection terminal via the through-hole,
    wherein the chip connection terminal, an inner portion of the through-hole, and a first portion of the external connection terminal have a soft plating, a second portion of the external connection terminal has a hard gold plating, and the second portion is continuous with the first portion without overlap.

6. The semiconductor device as defined in claim 5, wherein the external connection terminal has a flat portion.

7. The semiconductor device as defined in claim 5, wherein the chip connection terminal has a flat portion.

8. The semiconductor device as defined in claim 5, wherein the chip connection terminal is located on the periphery of the substrate.

9. A semiconductor device comprising:
    a substrate having a first side, a second side, and a through-hole formed so as to penetrate the first side and the second side;
    an external connection terminal on the first side of the substrate;
    a chip connection terminal on the second side of the substrate, the chip connection terminal being electrically connected to the external connection terminal via the through-hole;

a semiconductor chip attached to the second side of the substrate and electrically connected to the chip connection terminal; and a resin molding over at least a portion of the second side of the substrate, wherein the external connection terminal, an inner portion of the through-hole, and a first portion of the chip connection terminal have a hard hold plating, a second portion of the chip connection terminal has a soft gold plating, and the second portion is continuous with the first portion without overlap.

10. The semiconductor device as defined in claim 9, wherein the chip connection terminal and the semiconductor chip are connected using a wire.

11. The semiconductor device as defined in claim 9, wherein the chip connection terminal and the semiconductor chip are connected using a flip-chip connection.

12. A semiconductor device substrate comprising:

a substrate having a first side, a second side, and a through-hole formed so as to penetrate the first side and the second side;

an external connection terminal on the first side of the substrate;

a chip connection terminal on the second side of the substrate, the chip connection terminal being electrically connected to the external connection terminal via the through-hole;

a semiconductor chip attached to the second side of the substrate and electrically connected to the chip connection terminal; and a resin molding over at least a portion of the second side of the substrate, wherein the chip connection terminal, an inner portion of the through-hole, and a first portion of the external connection terminal have a soft gold plating, a second portion of the external connection terminal has a hard gold plating, and the second portion is continuous with the first portion without overlap.

13. The semiconductor device as defined in claim 12, wherein the chip connection terminal and the semiconductor chip are connected using a wire.

14. The semiconductor device as defined in claim 12, wherein the chip connection terminal and the semiconductor chip are connected using a flip-chip connection.

15. A card-type module that includes a semiconductor device, the card-type module comprising:

a card-type supporter having a recess;

a substrate having a first side, a second side, and a through-hole formed so as to penetrate the first side and the second side;

an external connection terminal on the first side of the substrate;

a chip connection terminal on the second side of the substrate, the chip connection terminal being electrically connected to the external connection terminal via the through-hole;

a semiconductor chip attached to the second side of the substrate and electrically connected to the chip connection terminal; and a resin molding over the at least a portion of the second side of the substrate, wherein the external connection terminal, an inner portion of the through-hole, and a first portion of the chip connection terminal have a hard gold plating, a second portion of the chip connection terminal has a soft gold plating, the second portion is continuous with the first portion without overlap, and the substrate is bonded to the recess of the card-type supporter by burying the resin-molded side of the substrate.

16. A card-type module that includes a semi-conductor device, the card-type module comprising:

a card-type supporter having a recess;

a substrate having a first side, a second side, and a through-hole formed so as to penetrate the first side and the second side;

an external connection terminal on the first side of the substrate;

a chip connection terminal on the first side of the substrate, the chip connection terminal being electrically connected to the external connection terminal via the through-hole;

a semiconductor chip attached to the second side of the substrate and electrically connected to the chip connection terminal; and a resin molding over the at least a portion of the second side of the substrate, wherein the chip connection terminal, an inner portion of the through-hole, and a first portion of the external connection terminal have a soft gold plating, a second portion of the external connection terminal has a hard gold plating, the second portion is continuous with the first portion without overlap, and the substrate is bonded to the recess of the card-type supporter by burying the resin-molded side of the substrate.

17. A memory device comprising:

a card type module including:

a card-type supporter having a recess;

a substrate having a first side, a second side, and a through-hole formed so as to penetrate the first side and the second side;

an external connection terminal on the first side of the substrate;

a chip connection terminal on the second side of the substrate, the chip connection terminal being electrically connected to the external connection terminal via the through-hole;

a semiconductor chip attached to the second side of the substrate and electrically connected to the chip connection terminal; and a resin molding over the at least a portion of the second side of the substrate; and a main body including:

a first connector connected to the external connection terminal of the card-type module;

a second connector connected to an apparatus; and an interface control circuit connected to the first and second connectors, wherein the external connection terminal, an inner portion of the through-hole, and a first portion of the chip connection terminal have a hard gold plating, a second portion of the chip connection terminal has a soft gold plating, the second portion is continuous with the first portion without overlap, and the substrate is bonded to the recess of the card-type supported by burying the resin-molded side of the substrate.

18. A memory device comprising:

a card-type module including:

a card-type supporter having a recess;

a substrate having a first side, a second side, and a through-hole formed so as to penetrate the first side and the second side;

an external connection terminal on the first side of the substrate;

a chip connection terminal on the second side of the substrate, the chip connection terminal being electrically connected to the external connection terminal via the through-hole;

a semiconductor chip attached to the second side of the substrate and electrically connected to the chip connection terminal; and a resin molding over the at least a portion of the second side of the substrate; and a main body including:

a first connector connected to the external connection terminal of the card-type module;

a second connector connected to an apparatus; and an interface control circuit connected to the first and second connectors, wherein the chip connection terminal, an inner portion of the through-hole, and a first portion of the external connection terminal have a soft gold plating, a second portion of the external connection terminal has a hard gold plating, the second portion is continuous with the first portion without overlap, and the substrate is bonded to the recess of the card-type supporter by burying the resin-molded side of the substrate.

* * * * *